(12) United States Patent
Xiang et al.

(10) Patent No.: US 9,052,147 B2
(45) Date of Patent: Jun. 9, 2015

(54) LOOP HEAT PIPE STRUCTURE WITH LOW-PROFILE EVAPORATOR

(75) Inventors: Jun Xiang, Shenzhen (CN); Xiao-Xiang Zhou, Shenzhen (CN)

(73) Assignee: Asia Vital Components (Shen Zhen) Co., Ltd., Shenzhen (CN)

( * ) Notice: Subject to any disclaimer, the term of this patent is extended or adjusted under 35 U.S.C. 154(b) by 626 days.

(21) Appl. No.: 13/156,324

(22) Filed: Jun. 8, 2011

(65) Prior Publication Data
US 2012/0273167 A1 Nov. 1, 2012

(30) Foreign Application Priority Data
Apr. 29, 2011 (CN) .......................... 2011 1 0110326

(51) Int. Cl.
F28D 15/04 (2006.01)
F28D 15/02 (2006.01)
H01L 23/427 (2006.01)

(52) U.S. Cl.
CPC .......... *F28D 15/0266* (2013.01); *H01L 23/427* (2013.01); *F28D 15/0275* (2013.01); *F28D 15/046* (2013.01); *H01L 2924/0002* (2013.01)

(58) Field of Classification Search
CPC ............ F28D 15/0233; F28D 15/0266; F28D 15/043; F28D 15/046; F28D 15/04; F28D 15/0275; H01L 23/427; H01L 2924/0002

USPC .......... 165/104.21, 104.22, 104.26, 168, 169, 165/104.19
See application file for complete search history.

(56) References Cited

U.S. PATENT DOCUMENTS

| 6,227,288 | B1 * | 5/2001 | Gluck et al. ............. 165/104.26 |
| 6,330,907 | B1 * | 12/2001 | Ogushi et al. ............. 165/104.26 |
| 7,692,926 | B2 * | 4/2010 | Henderson et al. ........... 361/701 |
| 8,397,798 | B2 * | 3/2013 | Kroliczek et al. ........ 165/104.26 |
| 2003/0192669 | A1 * | 10/2003 | Wu ................................ 165/46 |
| 2003/0211791 | A1 * | 11/2003 | Wu .................................... 442/6 |
| 2007/0006994 | A1 * | 1/2007 | Liu et al. .................. 165/104.26 |
| 2007/0187072 | A1 * | 8/2007 | Chin et al. ............... 165/104.26 |
| 2008/0283223 | A1 * | 11/2008 | Chang et al. ............. 165/104.26 |
| 2009/0321055 | A1 * | 12/2009 | Wang et al. ............. 165/104.26 |
| 2010/0300656 | A1 * | 12/2010 | Lu et al. .................. 165/104.26 |

* cited by examiner

*Primary Examiner* — Tho V Duong
*Assistant Examiner* — Aaron Isenstadt
(74) *Attorney, Agent, or Firm* — C. G. Mersereau; Nikolai & Mersereau, P.A.

(57) ABSTRACT

A loop heat pipe structure includes an evaporator and a first pipe. The evaporator has a first chamber, a first wick layer, and a bottom. The first wick layer is provided in the first chamber. The first pipe includes a first inlet and a first outlet communicably connected to the evaporator. The first inlet internally defines a second chamber communicable with the first wick layer. By providing the second chamber outside the evaporator, the evaporator can have a reduced overall height without creating very high vapor pressure in the evaporator, enabling the loop heat pipe structure to have upgraded heat dissipation efficiency.

17 Claims, 18 Drawing Sheets

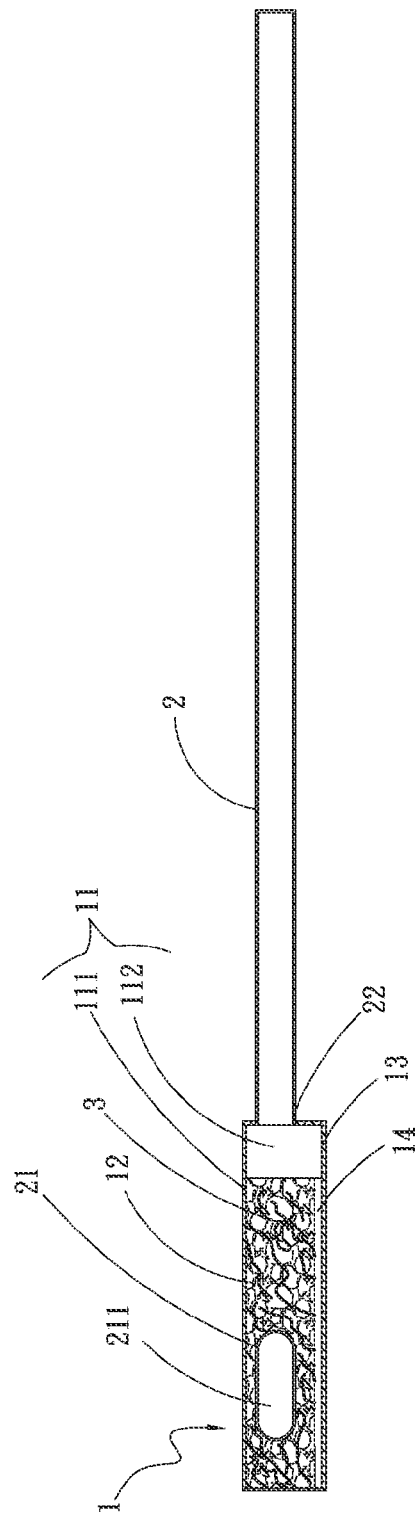

C-C Profile

B-B Profile

US 9,052,147 B2

LOOP HEAT PIPE STRUCTURE WITH LOW-PROFILE EVAPORATOR

This application claims the priority benefit of China patent application number 201110110326.6 filed on Apr. 29, 2011.

FIELD OF THE INVENTION

The present invention relates to a loop heat pipe structure, and more particularly to a loop heat pipe structure that includes an evaporator with largely reduced height to thereby overcome the problem of limited space available in an electronic device and to effectively prevent the occurrence of heat leak.

BACKGROUND OF THE INVENTION

Due to the progress in the semiconductor technology, integrated circuit (IC) chips have been widely used in various electronic apparatus, such as personal computers, notebook computers and network servers. While the IC chips have significantly increased computing speed and functions, they also generate correspondingly increased waste heat. Such waste heat must be effectively removed to protect the electronic apparatus against failure. Various heat dissipation means are therefore developed to achieve effective removal of the heat generated by the IC chips.

One of the heat dissipation means is loop heat pipe (LHP). In a conventional loop heat pipe structure, there is included a reservoir or a compensation chamber for storing an adequate amount of working fluid, so that the evaporator for the loop heat pipe structure can be properly furnished with the working fluid and adapt to the volume change of the working fluid caused by density change thereof. The reservoir or compensation chamber also filters gas or bubbles in the working fluid, so that the working fluid is not interfered and damaged by the contained gas or bubbles.

While the conventional loop heat pipe structure provides a lot of advantages, it has a cylindrical evaporator that occupies a relatively large space and fails to directly contact with the heat source due to the round outer surface thereof. To overcome such disadvantages, a flat plate loop heat pipe (FPLHP) structure has been developed. In the currently available flat plate loop heat pipe structure, the compensation chamber is located above a wick structure provided inside the evaporator. The loop heat pipe structure with the compensation chamber provided above the wick structure in the evaporator tends to have serious heat leak, which brings difficulty in the start-up of the flat plate loop heat pipe structure and leads to increased total thermal resistance.

Moreover, the currently available flat plate loop heat pipe structure usually has an evaporator made of only one type of material for both of its wall portions and bottom. However, the bottom of the evaporator in contact with the heat source should have higher thermal conductivity than the wall portions of the evaporation. Further, due to the special construction of the flat plate loop heat pipe structure, when the bottom of the evaporator is in contact with the heat source, the heat is also transferred via the wall portions of the evaporator to heat the working fluid in the reservoir or compensation chamber. In some cases, the amount of heat transferred to the reservoir or compensation chamber is even equal to that causing the heat leak via the wick structure in the evaporator. A combined effect of the above two conditions badly affects the thermal performance of the flat plate loop heat pipe structure to even offset the advantages thereof.

Furthermore, the currently available electronic devices are so designed that they have constantly reduced size, volume and weight, and accordingly, largely reduced internal space. As a result, it has become the most important task to design a heat dissipation device that has small size and low profile to adapt to the limited inner space of the current electronic devices.

SUMMARY OF THE INVENTION

A primary object of the present invention is to provide a loop heat pipe structure capable of preventing the occurrence of heat leak and accordingly having upgraded heat dissipation performance.

Another object of the present invention is to provide a loop heat pipe structure that includes an evaporator with reduced overall height, and accordingly, can be used in electronic devices having narrow internal space.

To achieve the above and other objects, the loop heat pipe structure according to the present invention includes an evaporator and a first pipe. The evaporator has a first chamber, a first wick layer, a bottom, and a plurality of grooves. The first wick layer is provided in the first chamber to thereby define a first main chamber and a first secondary chamber in the first chamber. The first wick structure is filled with a working fluid. The grooves are selectively provided on the first wick layer or the bottom. The first pipe has a first inlet and a first outlet. The first inlet internally defines a second chamber, and is connected to a wall of the evaporator to communicate with the first wick layer. The first outlet is connected to another wall of the evaporator to communicate with the first secondary chamber.

Since the second chamber is located outside the evaporator, the condition of heat leak from the first wick layer in the first chamber into the second chamber can be effectively prevented. That is, the working fluid in the second chamber will not be overheated to form vapor-liquid phase equilibrium and produce high saturation vapor pressure in the second chamber, and the liquid-phase working fluid in the first pipe would not be stopped from returning to the second chamber. Further, with the second chamber located outside the evaporator, the evaporator can have a largely reduced overall height, allowing the loop heat pipe structure to be used in an electronic device with limited internal space.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 3a is a sectional view taken along line A-A of FIG. 2;

DETAILED DESCRIPTION OF THE PREFERRED EMBODIMENTS

Figure 1:
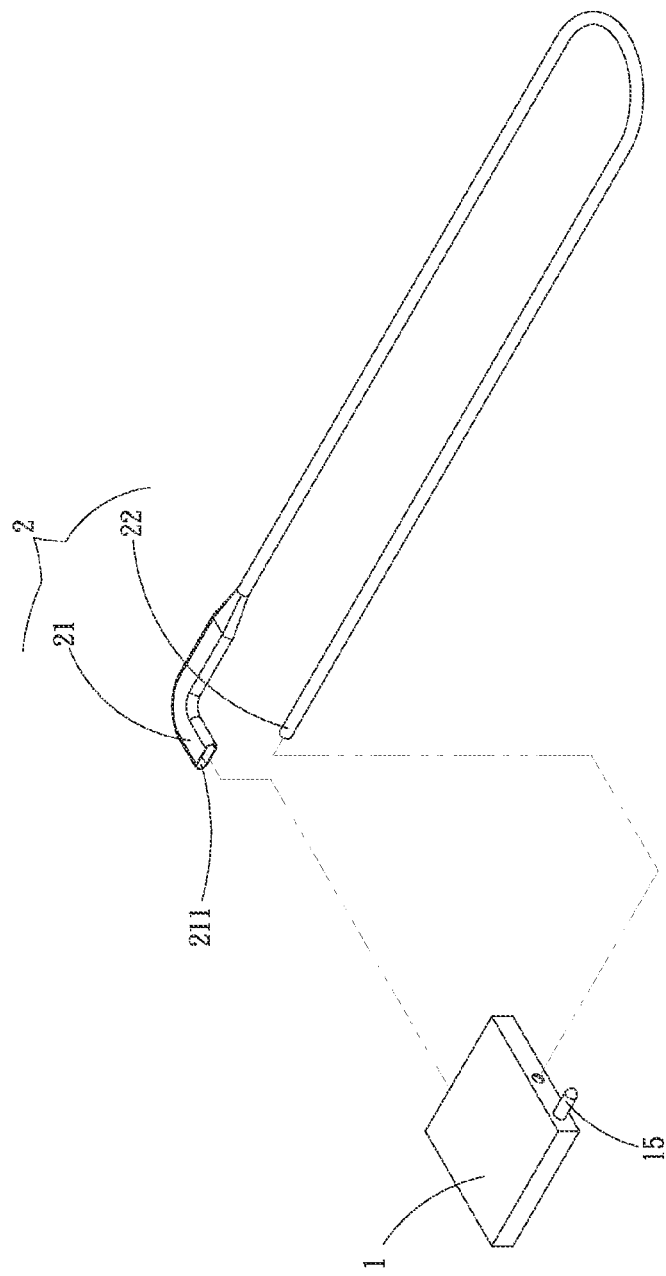
FIG. 1 is an exploded perspective view of a loop heat pipe structure with low-profile evaporator according to a first embodiment of the present invention.

The present invention will now be described with some preferred embodiments thereof and with reference to the accompanying drawings. For ease of understanding, elements that are the same in the preferred embodiments are denoted by the same reference numerals.

Figure 2:
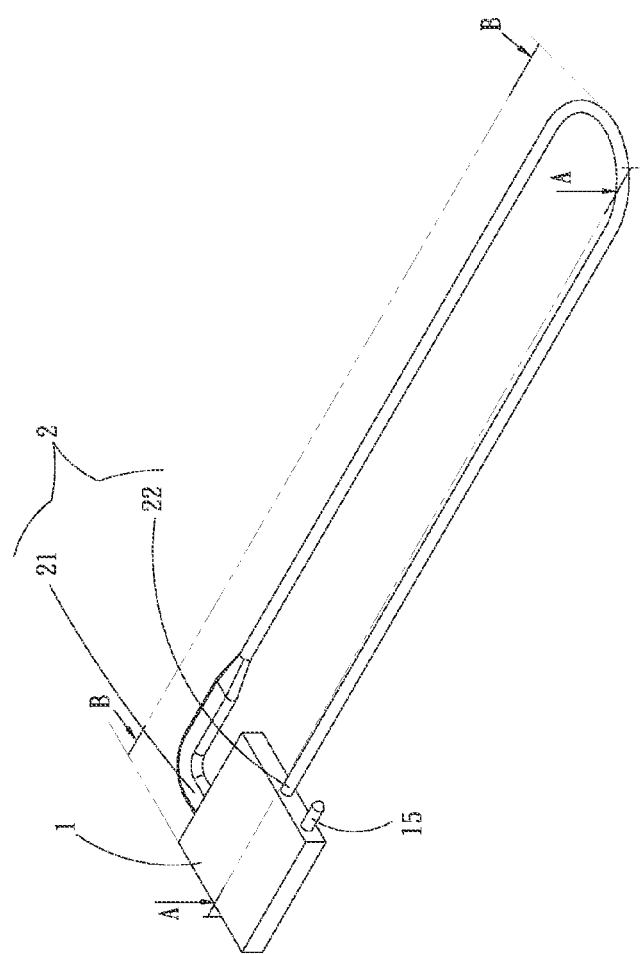
FIG. 2 is an assembled view of FIG. 1.

Please refer to FIGS. 1 and 2 that are exploded and assembled perspective views, respectively, of a loop heat pipe structure with low-profile evaporator according to a first embodiment of the present invention. For the purpose of conciseness, the present invention is also briefly referred to as a "loop heat pipe structure" herein. As shown, in the first embodiment, the loop heat pipe structure includes an evaporator 1 and a first pipe 2.

Figure 3B:
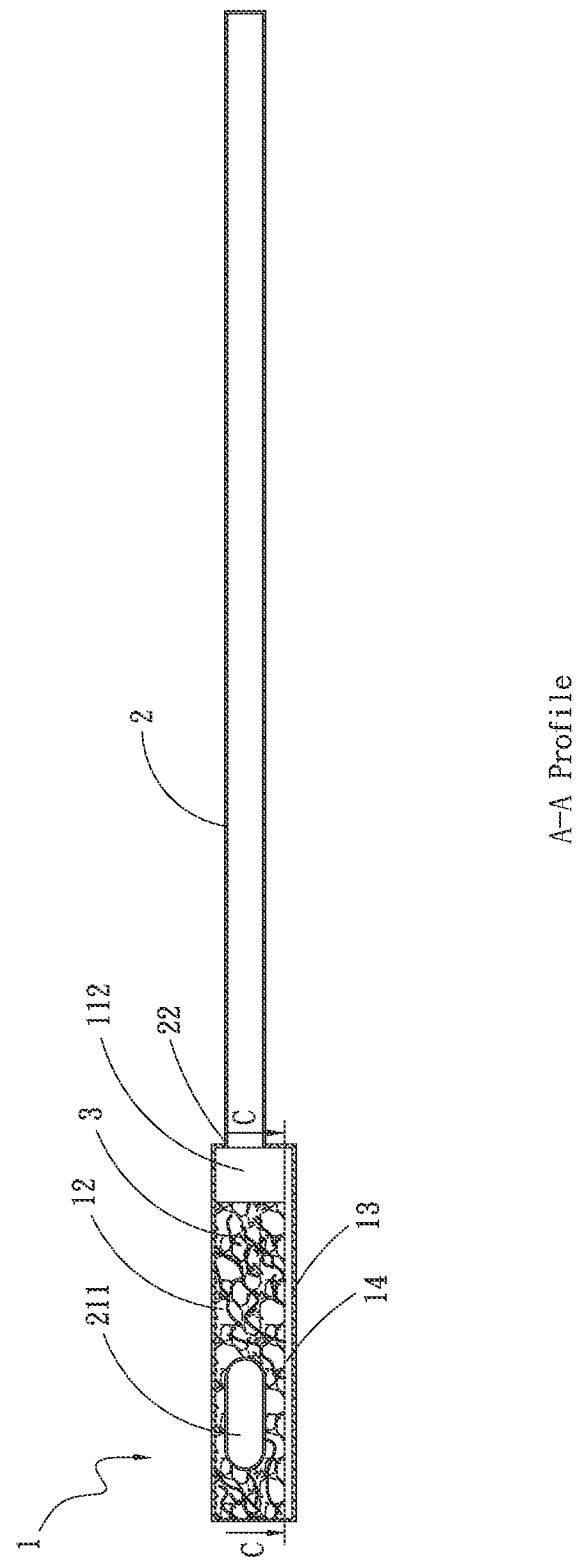
FIG. 3b is another sectional view taken along line A-A of FIG. 2 according to a variant of the first embodiment of the present invention.
Figure 3C:
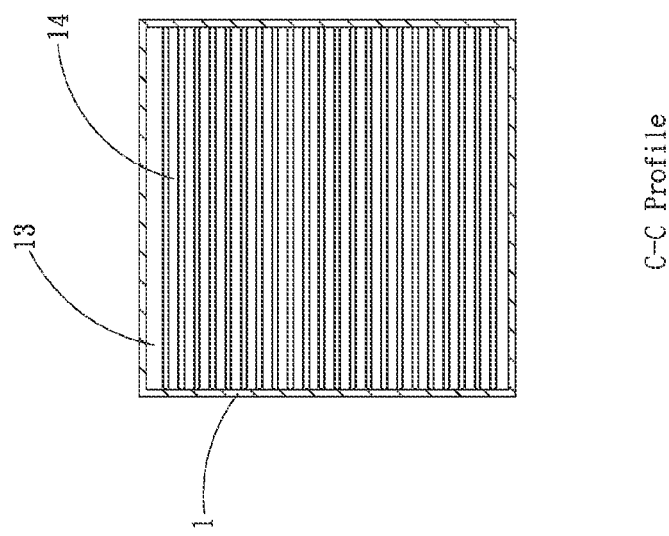
FIG. 3c is a sectional view taken along line C-C of FIG. 3b.

The evaporator 1 has a first chamber 11, a first wick layer 12, a bottom 13, and a plurality of grooves 14. The first wick layer 12 is provided in the first chamber 11 to define a first main chamber 111 and a first secondary chamber 112 in the first chamber 11. A working fluid 3 is filled in the first wick layer 12. While the first embodiment is illustrated with the grooves 14 provided on the first wick layer 12 as can be seen from FIG. 3a, it is understood the grooves 14 can be selectively provided on any one of the first wick layer 12 and the bottom 13. For example, in a variant of the first embodiment as shown in FIG. 3b, the grooves 14 are provided on the bottom 13. Please refer to FIG. 3c, which is a sectional view taken along line C-C of FIG. 3b, the grooves 14 provided on the bottom 13 are spaced from one another.

Figure 4A:
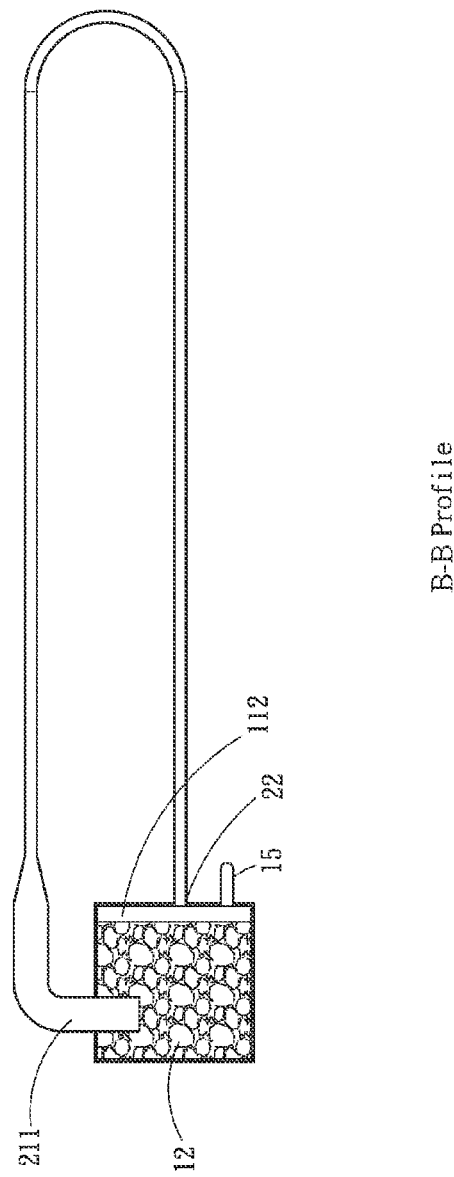
FIG. 4a is a sectional view taken along line B-B of FIG. 2.
Figure 4B:
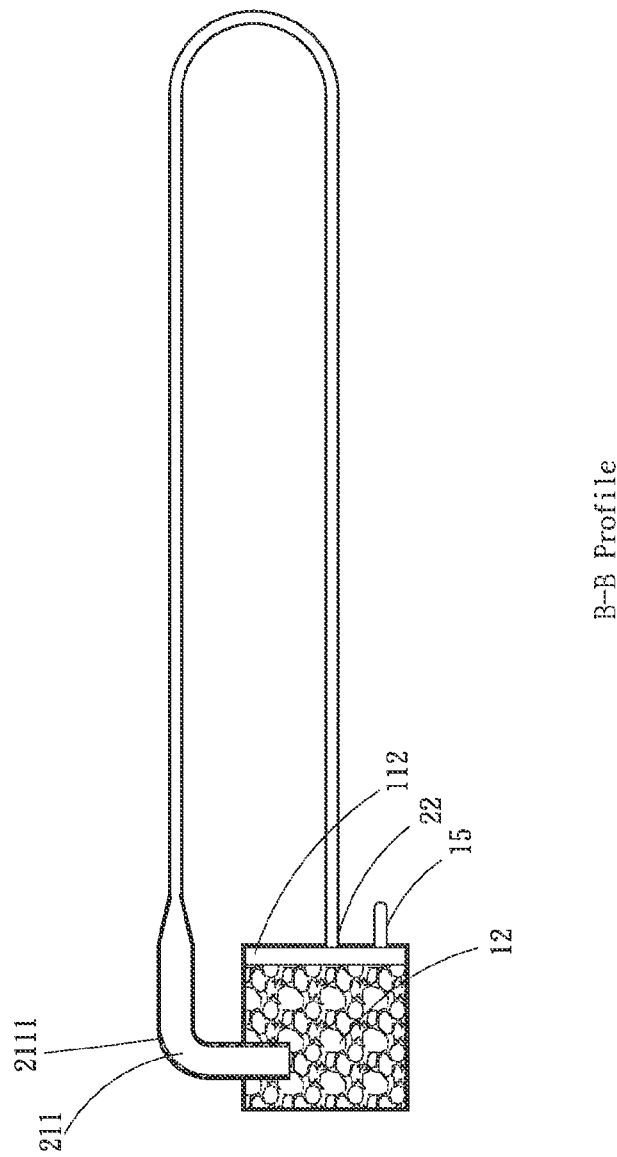
FIG. 4b is another sectional view taken along line B-B of FIG. 2 according to a variant of the first embodiment of the present invention.

Please refer to FIG. 4a, which is a sectional view taken along line B-B of FIG. 2. The first pipe 2 has a first inlet 21 and a first outlet 22. The first inlet 21 internally defines a second chamber 211 and is connected to one wall of the evaporator 1 to communicate with the first wick layer 12 in the evaporator 1. The first outlet 22 is connected to another wall of the evaporator 1 to communicate with the first secondary chamber 112. According to a variant of the first embodiment, the second chamber 211 is internally provided with a second wick layer 2111, as shown in FIG. 4b.

While the first embodiment is illustrated with the first wick layers 12 being a sintered powder body, it is understood the first wick layer 12 can be any one of a sintered powder body, a net-like body, carbon fibers, and graphite.

The evaporator 1 further includes a working pipe 15, which has an end communicating with the first chamber 11.

Figure 5A:
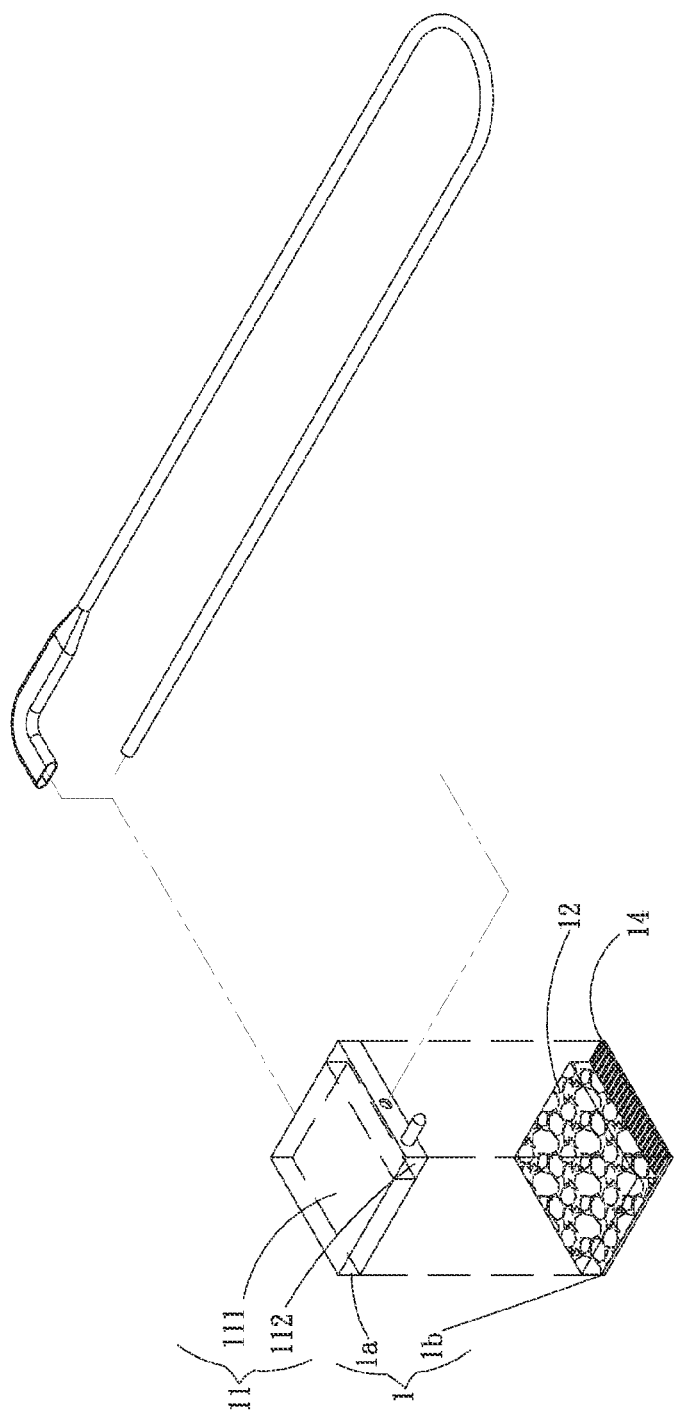
FIG. 5a is an exploded perspective view of a loop heat pipe structure with low-profile evaporator according to a second embodiment of the present invention.
Figure 5B:
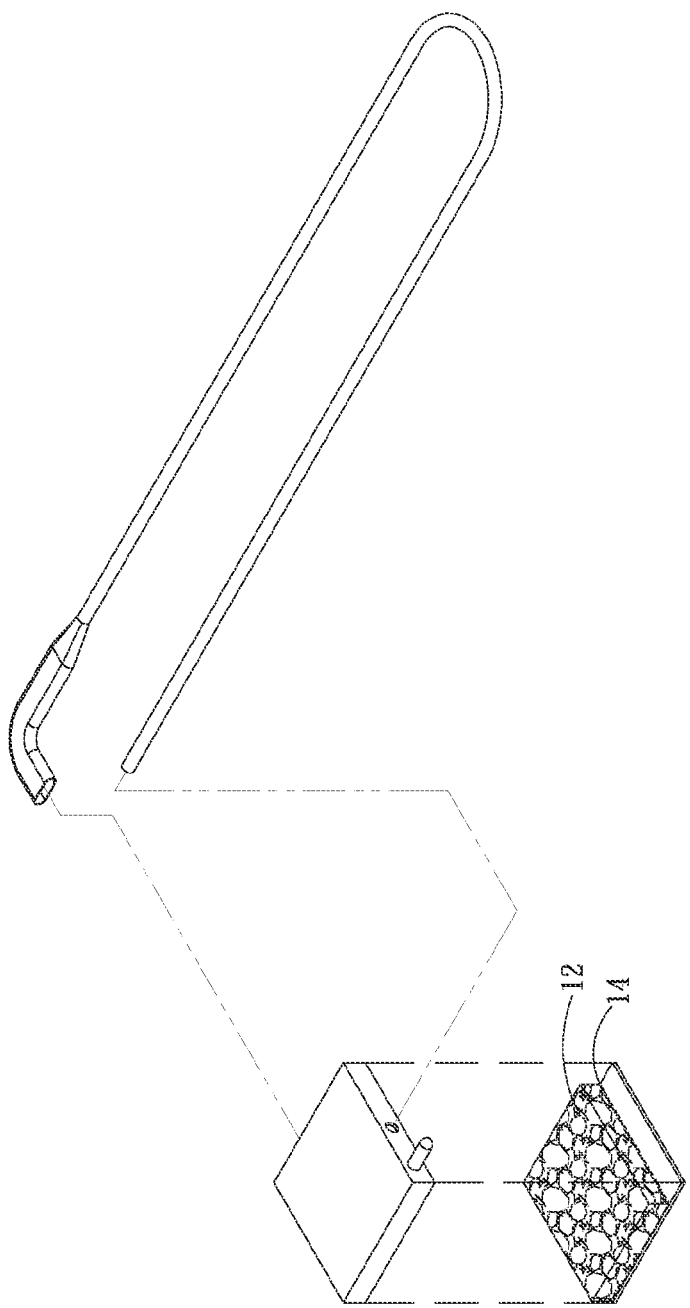
FIG. 5b is an exploded perspective view of a variant of the second embodiment of the present invention.
Figure 6:
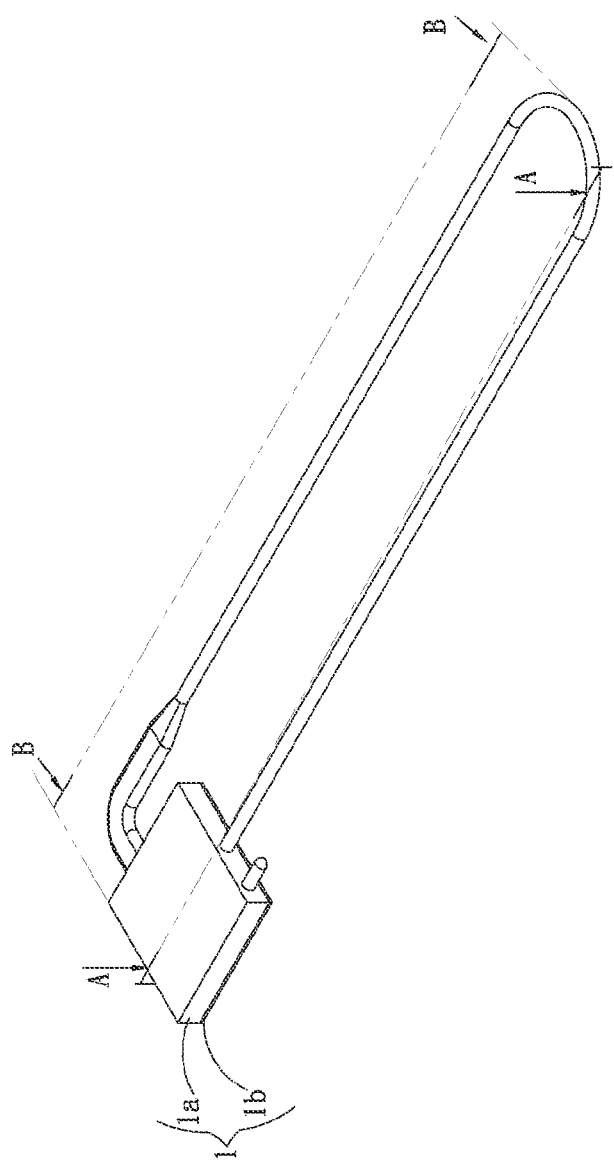
FIG. 6 is an assembled perspective view of the loop heat pipe structure with low-profile evaporator according to the second embodiment of the present invention.

Please refer to FIGS. 5a and 6 that are exploded and assembled perspective views, respectively, of a heat pipe structure according to a second embodiment of the present invention, and to FIG. 5b that is an exploded perspective view of a variant of the second embodiment. As shown, the second embodiment is generally structurally similar to the first embodiment, except that, in the second embodiment, the evaporator 1 includes a cover 1a and a bottom plate 1b correspondingly closed to each other and the first wick layer 12 is provided on the bottom plate 1b to define the first main chamber 111 and the first secondary chamber 112 between the cover 1a and the bottom plate 1b. While the second embodiment is illustrated with the grooves 14 provided on the bottom plate lb as can be seen from FIG. 5a, it is understood the grooves 14 can be selectively provided on any one of the first wick layer 12 and the bottom plate 1b. For example, in a variant of the second embodiment as shown in FIG. 5b, the grooves 14 are provided on the first wick layer 12.

Figure 7:
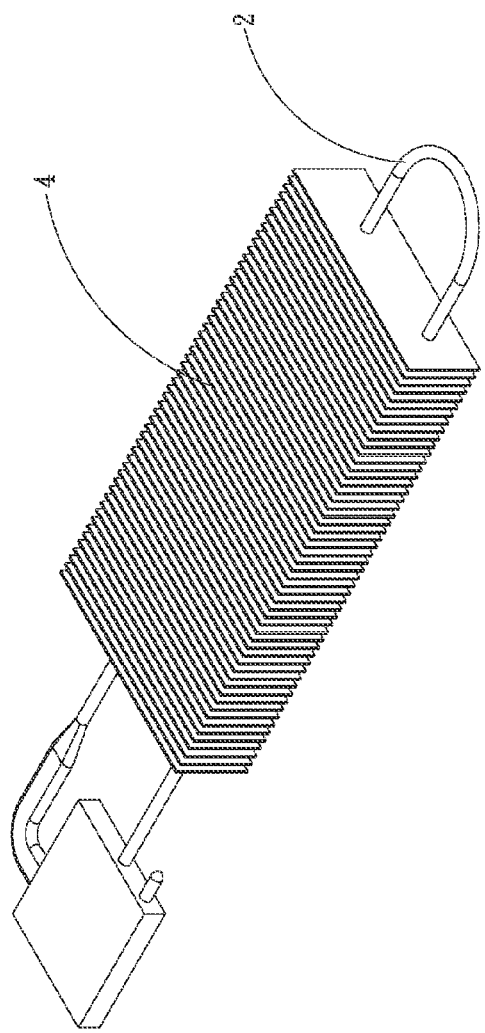
FIG. 7 is an assembled perspective view of a loop heat pipe structure with low-profile evaporator according to a third embodiment of the present invention.

FIG. 7 is a perspective view of a loop heat pipe structure according to a third embodiment of the present invention. As shown, the third embodiment is generally structurally similar to the first embodiment, except that, in the third embodiment, the first pipe 2 is extended through a plurality of radiating fins 4.

Figure 8:
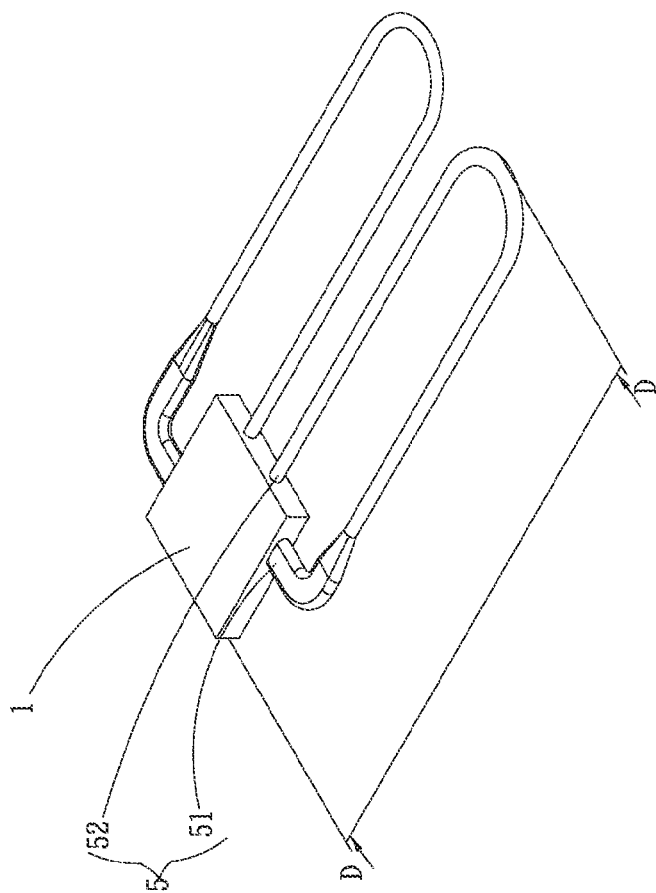
FIG. 8 is an assembled perspective view of a loop heat pipe structure with low-profile evaporator according to a fourth embodiment of the present invention.
Figure 9A:
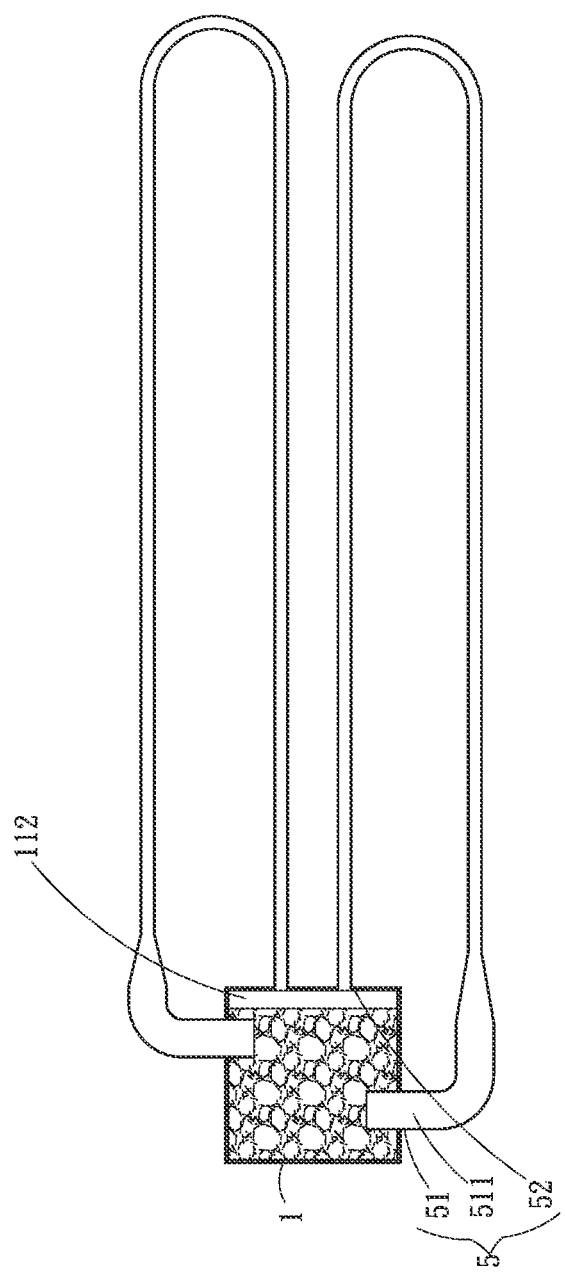
FIG. 9a is a sectional view taken along line D-D of FIG. 8.
Figure 9B:
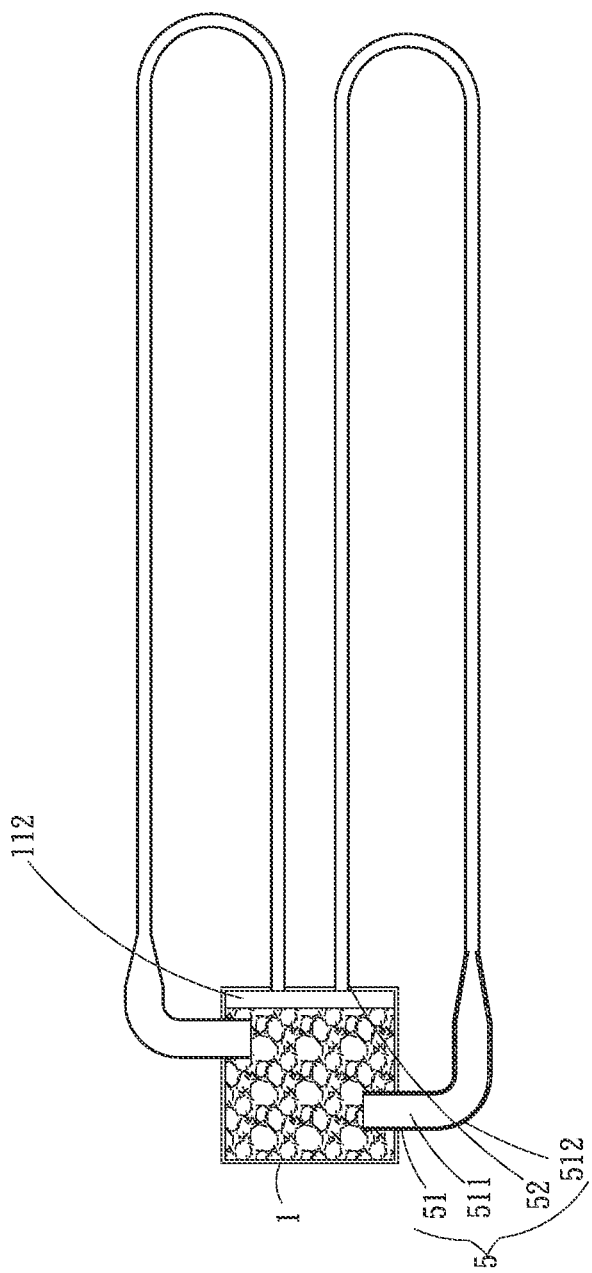
FIG. 9b is another sectional view taken along line D-D of FIG. 8 according to a variant of the fourth embodiment of the present invention.

FIG. 8 is an assembled perspective view of a loop heat pipe structure according to a fourth embodiment of the present invention, and FIG. 9a is a sectional view taken along line D-D of FIG. 8. As shown, the fourth embodiment is generally structurally similar to the first embodiment, except that, in the fourth embodiment, a second pipe 5 is further provided. The second pipe 5 has a second inlet 51 and a second outlet 52. The second inlet 51 internally defines a third chamber 511, and is connected to one wall of the evaporator 1 to communicate with the first wick layer 12. The second outlet 52 is connected to another wall of the evaporator 1 to communicate with the first secondary chamber 112. According to a variant of the fourth embodiment, the third chamber 511 is internally provided with a third wick layer 512, as shown in FIG. 9b.

Figure 10:
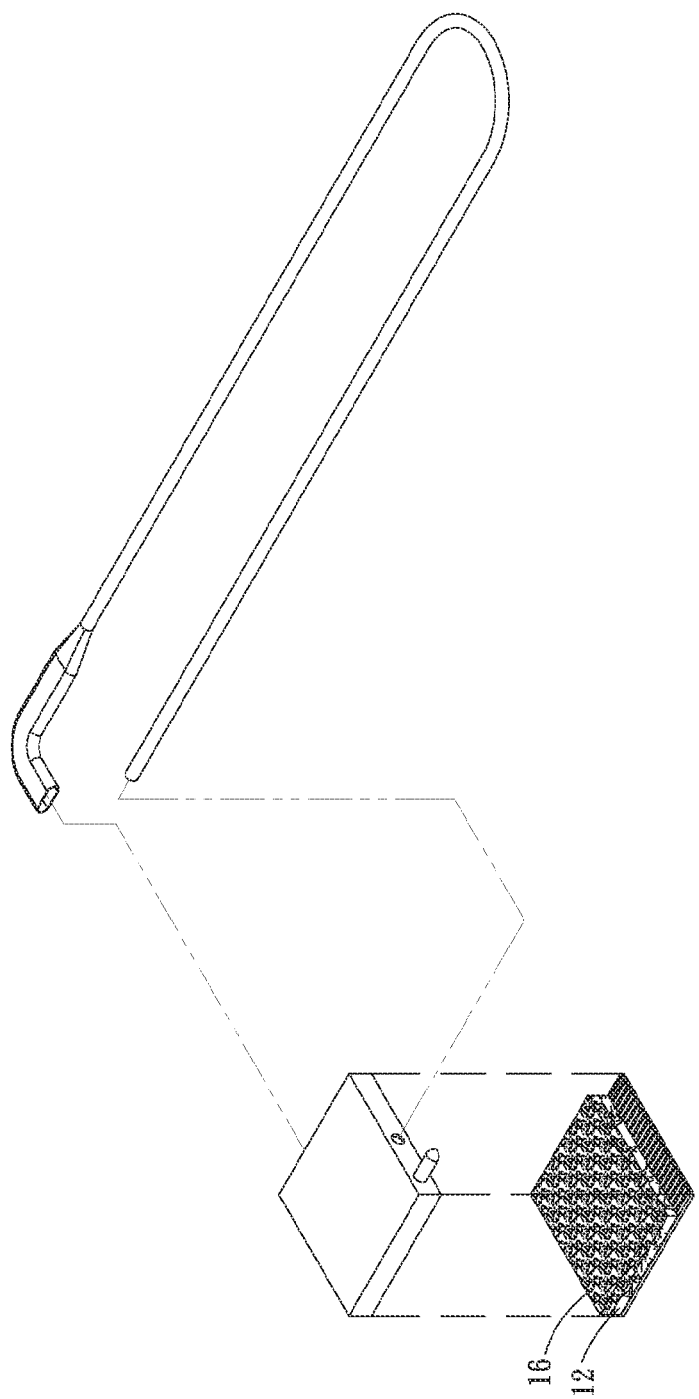
FIG. 10 is an exploded perspective view of a loop heat pipe structure with low-profile evaporator according to a fifth embodiment of the present invention.

FIG. 10 is an exploded perspective view of a loop heat pipe structure according to a fifth embodiment of the present invention. As shown, the fifth embodiment is generally structurally similar to the second embodiment, except that, in the fifth embodiment, a fourth wick layer 16 is further provided to one side of the first wick layer 12.

Figure 11:
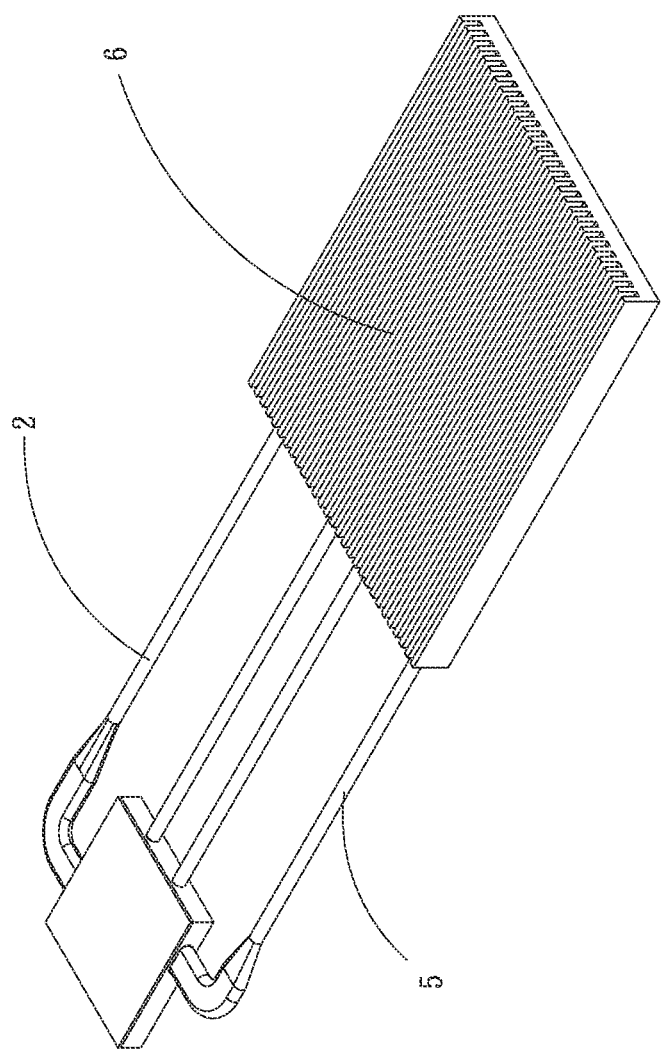
FIG. 11 is an assembled perspective view of a loop heat pipe structure with low-profile evaporator according to a sixth embodiment of the present invention.

FIG. 11 is a perspective view of a loop heat pipe structure according to a sixth embodiment of the present invention. As shown, the sixth embodiment is generally structurally similar to the fourth embodiment, except that, in the sixth embodiment, the first pipe 2 and the second pipe 5 are extended through a condensing device 6.

Figure 12:
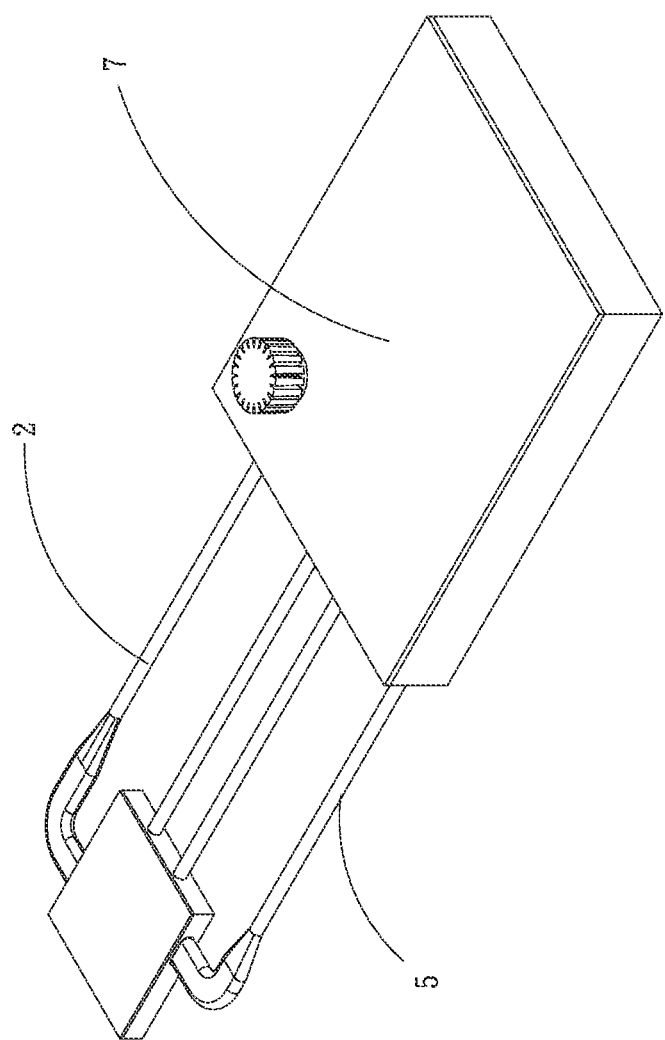
FIG. 12 is an assembled perspective view of a loop heat pipe structure with low-profile evaporator according to a seventh embodiment of the present invention.

FIG. 12 is a perspective view of a loop heat pipe structure according to a seventh embodiment of the present invention. As shown, the seventh embodiment is generally structurally similar to the fourth embodiment, except that, in the seventh embodiment, the first pipe 2 and the second pipe 5 are extended through a water-cooled device 7.

In the embodiments of the present invention, the second and the third wick layer 2111, 512 have permeability larger than that of the first wick layer 12, and the first and the second inlet 21, 51 respectively have a flat configuration.

Figure 13:
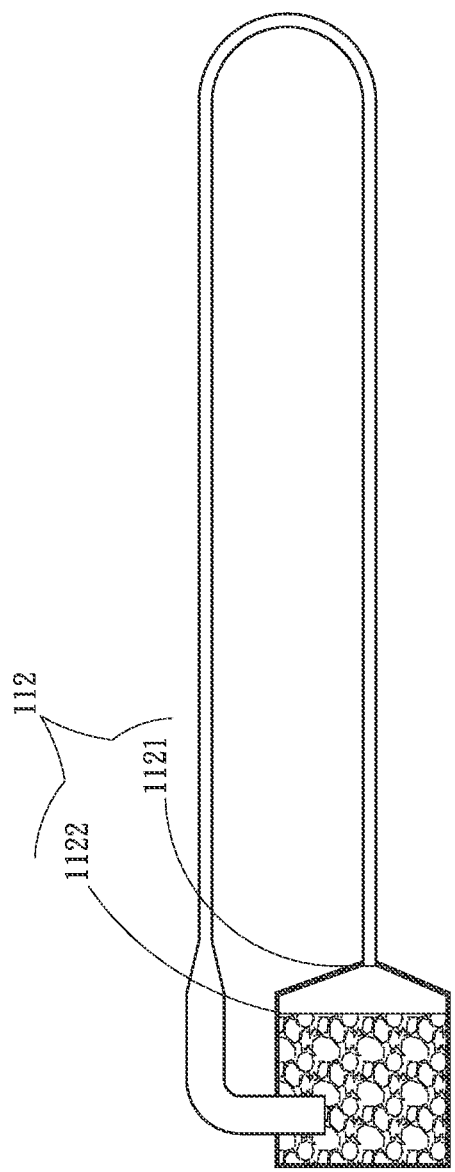
FIG. 13 is an assembled sectional view of a loop heat pipe structure with low-profile evaporator according to an eighth embodiment of the present invention.

Please refer to FIG. 13 that is an assembled sectional view of a loop heat pipe structure according to an eighth embodiment of the present invention. As shown, the eighth embodiment is generally structurally similar to the first embodiment, except that, in the eighth embodiment, the first secondary chamber 112 has a first end 1121 coupled with the first outlet of the first pipe and an opposite second end 1122 adjacent to the first chamber. The first end 1121 and the second end 1122 communicate with each other, and the first secondary chamber 112 is tapered from the second end 1122 toward the first end 1121.

The second wick layer 2111 has an effective capillary radius larger than or equal to that of the first wick layer 12, and has thermal conductivity lower than that of the first wick layer 12.

Please refer to FIGS. 1 through 13. In practical implementation of the loop heat pipe structure of the present invention, the first wick layer 12 has an effective capillary radius smaller than that of the second wick layer 2111, and has thermal conductivity higher than that of the second wick layer 2111. With this design, the thermal resistance between the evaporator 1 and the second chamber 211 can be increased to reduce the heat reversely permeating from the evaporator 1 to the second chamber 211 during operation of the evaporator 1. Further, since the second chamber 211 is located outside the evaporator 1, the condition of heat leak from the first wick layer 12 in the first chamber 11 into the second chamber 211 can be effectively prevented. That is, the working fluid 3 in the second chamber 211 will not be overheated to form vapor-liquid phase equilibrium and produce high saturation vapor pressure in the second chamber 211, and the liquid-phase working fluid 3 in the first pipe 2 would not be stopped from returning to the second chamber 211.

In conclusion, the above-described structural design is able to create better heat lock effect.

The above-described structure can provide sufficient capillary force required by the whole loop heat pipe structure to work normally under both standard and anti-gravity conditions with reduced local thermal resistance.

The loop heat pipe structure according to the present invention provides the following advantages:

(1) Only the first wick layer 12 and the grooves 14 are provided inside the evaporator 1 while the second chamber 211 and the third chamber 511 of the loop heat pipe structure are located outside the evaporator 1. That is, the second and the third chambers 211, 511, respectively are located outside two walls of the evaporator 1 that are perpendicular to the direction in which the grooves 14 are extended.

(2) The second and the third chambers 211, 511, respectively can be located outside any walls of the evaporator 1 that are not provided with any outlet for vapor-phase working fluid, i.e. located outside any of three walls of the evaporator 1 that are not connected to the first secondary chamber 112.

(3) The first inlet 21 of the first pipe 2 and the second inlet 51 of the second pipe 5 may be configured as a diameter-expanded round pipe, a width-increased flat pipe, a rectangular chamber, or a space in any other suitable cross-sectional shape.

(4) The first inlet 21 and the second inlet 51 respectively have an internal design fulfilling the design requirement for the first wick layer.

(5) The second chamber 211 and the third chamber 511 are sized to adapt to any fluctuation in the volume of the working fluid caused by changes in temperature.

(6) By providing the second and the third chamber 211, 511 outside the evaporator 1, there are only considerably small contact areas between the walls of the evaporator 1 and each of the second and third chambers 211, 511. Therefore, the amount of heat leaked from the evaporator 1 into the second and third chambers 211, 511 is relatively low. That is, the saturated vapor pressure difference between the evaporator 1 and the second and third chambers 211, 511 is sufficient to satisfy the start-up requirement for the loop heat pipe structure.

(7) With the loop heat pipe structure according to the present invention, the evaporator 1 has an effectively reduced volume. That is, the evaporator 1 can have a reduced height or a reduced surface area in parallel with the heat source.

(8) The total thermal resistance of the loop heat pipe structure of the present invention can be controlled and limited to a relatively small range, as long as the second and third chambers 211, 511 have well designed volumes.

(9) Since the second chamber 211 is located outside the evaporator 1, the evaporator 1 can have a largely reduced overall height, allowing the loop heat pipe structure to have increased flexibility in its applications.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A loop heat pipe structure, comprising:
an evaporator having a first chamber, a first wick layer, a bottom and a plurality of grooves; the first chamber being a hollow chamber; the first wick layer being provided only in the first chamber to thereby define a first main chamber and a first secondary chamber in the first chamber; the first wick layer having a working fluid filled therein; and the grooves being selectively provided on the bottom; and wherein the first wick layer provided in the first main chamber directly contacts a top wall of said first main chamber; and
a first pipe having a first inlet portion and a first outlet; wherein the first inlet portion is an enlarged pipe section having a wider and flatter configuration than the first outlet, thereby internally defining a second chamber and is extended through a wall of the evaporator to insert into and communicate with the first wick layer; wherein the first outlet is not enlarged and is connected to another wall of the evaporator to communicate with the first secondary chamber; and wherein the second chamber is internally provided with a second wick layer which communicates with the first wick layer.

2. The loop heat pipe structure as claimed in claim 1, wherein the evaporator includes a cover and a bottom plate together enclosing the first chamber; the first wick layer being provided on the bottom plate to thereby define the first main chamber and the first secondary chamber in the first chamber; and the grooves being selectively provided on the bottom plate of the evaporator.

3. The loop heat pipe structure as claimed in claim 1, wherein the evaporator further includes a working pipe.

4. The loop heat pipe structure as claimed in claim 1, wherein the first wick layer is selected from the group consisting of a sintered powder body, a net-like body, carbon fibers, and graphite.

5. The loop heat pipe structure as claimed in claim 1, wherein the second wick layer has an effective capillary radius larger than that of the first wick layer.

6. The loop heat pipe structure as claimed in claim 1, wherein the second wick layer has thermal conductivity lower than that of the first wick layer.

7. The loop heat pipe structure as claimed in claim 1, wherein the first pipe is extended through a plurality of radiating fins.

8. The loop heat pipe structure as claimed in claim 1, further comprising a second pipe having a second inlet portion and a second outlet; wherein the second inlet portion is an enlarged pipe section having a wider and flatter configuration than the second outlet, thereby internally defining a third chamber and being connected to a wall of the evaporator to communicate with the first wick layer, and wherein the second outlet is not enlarged and is connected to another wall of the evaporator to communicate with the first secondary chamber.

9. The loop heat pipe structure as claimed in claim 8, wherein the third chamber is internally provided with a third wick layer.

10. The loop heat pipe structure as claimed in claim 1, wherein the second wick layer has permeability larger than that of the first wick layer.

11. The loop heat pipe structure as claimed in claim 9, wherein the third wick layer has permeability larger than that of the first wick layer.

12. The loop heat pipe structure as claimed in claim 1, wherein the first pipe is extended through a condensing device.

13. The loop heat pipe structure as claimed in claim 1, wherein the first pipe is extended through a water-cooled device.

14. The loop heat pipe structure as claimed in claim 8, wherein the second pipe is extended through a condensing device.

15. The loop heat pipe structure as claimed in claim 8, wherein the second pipe is extended through a water-cooled device.

16. The loop heat pipe structure as claimed in claim 1, further comprising a fourth wick layer provided to one side of the first wick layer.

17. The loop heat pipe structure as claimed in claim 1, wherein the first secondary chamber has a first end and an opposite second end; the first end and the second end communicating with each other; and the first secondary chamber being tapered from the second end toward the first end.

* * * * *